(12) United States Patent
Volz et al.

(10) Patent No.: US 6,900,743 B1
(45) Date of Patent: May 31, 2005

(54) MODE SELECTOR APPARATUS

(75) Inventors: Kenneth C. Volz, deceased, late of West Monroe, NY (US); by Carole A. Volz, legal representative, West Monroe, NY (US); Andrzej J. Gluszek, Liverpool, NY (US)

(73) Assignee: ABB Inc., Wickliffe, OH (US)

( * ) Notice: Subject to any disclaimer, the term of this patent is extended or adjusted under 35 U.S.C. 154(b) by 0 days.

(21) Appl. No.: 10/367,585

(22) Filed: Feb. 14, 2003

Related U.S. Application Data

(60) Provisional application No. 60/357,298, filed on Feb. 15, 2002.

(51) Int. Cl.[7] ............................................... H03M 7/00
(52) U.S. Cl. ........................................ 341/50; 324/72.5
(58) Field of Search ............................. 341/50; 326/30; 324/72.5; 345/82

(56) References Cited

U.S. PATENT DOCUMENTS

| | | | |
|---|---|---|---|
| 2,469,924 A | 5/1949 | Kunz, Jr. | |
| 3,588,780 A | 6/1971 | Takimoto | |
| 3,997,864 A | 12/1976 | Oka | |
| 4,038,598 A * | 7/1977 | Kapfer | 324/72.5 |
| 4,410,873 A | 10/1983 | Kuratani | |
| 4,504,818 A | 3/1985 | Okuya | |
| 4,523,174 A | 6/1985 | Oyama | |
| 4,542,366 A | 9/1985 | Oyama | |
| 4,571,571 A | 2/1986 | Onodera | |
| 4,737,602 A | 4/1988 | Yamamoto | |
| 4,780,701 A | 10/1988 | Eppinger | |
| 5,015,801 A | 5/1991 | Schaller | |
| 5,319,359 A | 6/1994 | Zampini | |
| 6,628,252 B2 * | 9/2003 | Hoshino et al. | 345/82 |

* cited by examiner

*Primary Examiner*—Michael Tokar
*Assistant Examiner*—Joseph Lauture
(74) *Attorney, Agent, or Firm*—George S. Blasiak, Esq.; Paul R. Katterle, Esq.

(57) ABSTRACT

A mode selector apparatus according to the invention includes a variable output device, a control circuit responsive to the output device, and a user perceivable indicator responsive to the control circuit. The control circuit reads the output from the output device to determine if the output indicates a valid mode. If the output of the output device indicates a valid mode, the control circuit controls the user-perceivable indicator to indicate to a user that the mode selector is operating in a valid mode, and generates a valid mode indicating signal at a valid mode indicating output of the apparatus.

30 Claims, 4 Drawing Sheets

MODE SELECTOR APPARATUS

CROSS REFERENCE TO RELATED APPLICATIONS

This application claims the priority, under 35 U.S.C. § 119, of U.S. Provisional Application No. 60/357,298, filed Feb. 15, 2002, entitled "Mode Selector Apparatus," which is incorporated in its entirety herein by reference.

FIELD OF THE INVENTION

The invention relates to electromechanical devices in general and more particularly to mode selectors.

BACKGROUND OF THE INVENTION

Currently available mode selector devices are configured so that a user actuates a member to make and/or break electrical contacts. For example in a mode selector apparatus 700 as shown in FIG. 7, three fixed contacts 702, 704, and 706 are provided together with a movable metal contact 710 actuateable by a sliding knob 715. The movable metal contact 710 is movable by a user to be selectively contactable with at least two of the three fixed contacts 702, 704, and 706. When metal contact 710 is in contact with first and second pads 702 and 704, a first valid mode is established. When metal contact 710 is in contact with second and third contact pads 704 and 706 a second valid mode of selector apparatus is defined. When metal contact 710 is in contact with only one or either of contact pads 702, 704, and 706 an invalid, or null mode of selector device is established. Mode selector apparatus 700 includes mechanical detent mechanisms 720 which provide a user feedback respecting the position of contact 710. When a user actuates sliding knob 715 from a position in which a first valid mode is defined to a position at which second valid mode is defined, the user is made aware of the movement by the click sound and the click feeling generated by detent mechanisms 720.

Mode selector apparatus of the prior art have numerous limitations. It is seen that prior art mode selector 700 includes a number of intricate and interrelated parts. The intricacy of these component parts leads to a high cost for the apparatus, increases the likelihood of a mechanical failure of apparatus 700, and therefore decreases the reliability and expected life of mode selector 700. The electrical contacts of mode selectors wherein electrical contacts are made and broken by manual movement of a mechanical member are especially susceptible to wear, poor accuracy, and failure. "Accuracy" of a mode selector as referred to herein shall refer to the likelihood that the mode selector is actually operating in the mode of operation indicated by a position feedback element of the selector. The large number of component parts of prior art mode selector 700 further increases the space consumed by mode selector 700, thereby rendering it inappropriate in certain applications requiring a small sized mode selector.

There is a need for a mode selector apparatus which is highly reliable, highly accurate, low cost, and small sized.

SUMMARY OF THE INVENTION

According to its major aspects and broadly stated the invention is a highly reliable high accuracy low cost mode selector apparatus which can be made in a small size, for packaging into products wherein space is restricted.

A mode selector of the invention includes a variable output device in communication with a control circuit which includes at least one output and which in turn is in communication with an indicator which indicates the mode of operation of the mode selector.

In one specific embodiment a DC voltage which is variable by adjustment of knob of a potentiometer is converted and input into a control circuit which has been preprogrammed to determine whether the input voltage is in a range indicative of a valid mode. If the converted input voltage into the control circuit is indicative of a valid mode, the control circuit controls a mode indicating output port of the control circuit to output a signal indicative of the valid mode being established. Further, an indicator may be responsive to the mode indicating output port or another signal whose state depends on the mode of operation of the mode selector apparatus so the user is provided with user feedback as to which mode the mode selector apparatus is presently in, as is determined by the position of the potentiometer knob. The indicator is conveniently provided by an LED or other light source. The visual feedback provided by the light source indicating that a certain mode has been realized replaces the "feel" feedback provided by the detent mechanism of the prior art mode selector apparatus.

A mode selector apparatus of the invention can have more than one valid mode. For example, a mode or apparatus select device of the invention can have a first valid mode established when the converted input voltage into the control circuit is indicative of a first valid mode and a second valid mode established when the converted input voltage into the control circuit is indicative of a second valid mode, and a Nth valid mode established when the input voltage into the control circuit is indicative of an Nth valid mode. A mode selector apparatus of the invention can also have one, a plurality of, or no "invalid" modes of operation. An invalid mode of operation as referred to herein is a mode of operation wherein no output port controlled by the control circuit is controlled to indicate a valid mode.

An important aspect of the invention is that a hysteresis is built into the mode indicating system of the mode selector apparatus to accommodate slight changes in the variable output device, e.g. potentiometer output voltages attributable to e.g. temperature changes, aging, or source voltage changes. In accordance with the invention, the exit condition input value range associated with a given valid mode is made wider than the enter condition input value range, and is made to encompass the enter condition range so that slight changes in the voltage input into the control circuit attributable to factors other than the variable output device being intentionally moved do not erroneously cause the mode of operation of the mode selector apparatus to change.

Numerous advantages are yielded by the invention. A mode selector of the invention includes a reduced number of mechanical components and thus can be made more inexpensively than prior art mode selectors while exhibiting a longer life, higher accuracy, and greater reliability. Further, potentiometers, particularly those that are free of any mechanical position indicators intermediate the low and high and stop-limit value points, are commonly available in very small sizes as is the case with integrated circuit processors and LED indicators. Accordingly, it can be seen that the invention, particularly when comprised of a PCB mounted output device, an IC processor, and a surface mount LED can be made in an extremely small size fittable in virtually any constrained space operating environment.

These and other details, advantages, and benefits of the present invention will become apparent from the detailed description of the preferred embodiment hereinbelow.

DETAILED DESCRIPTION OF THE INVENTION

Figure 1:
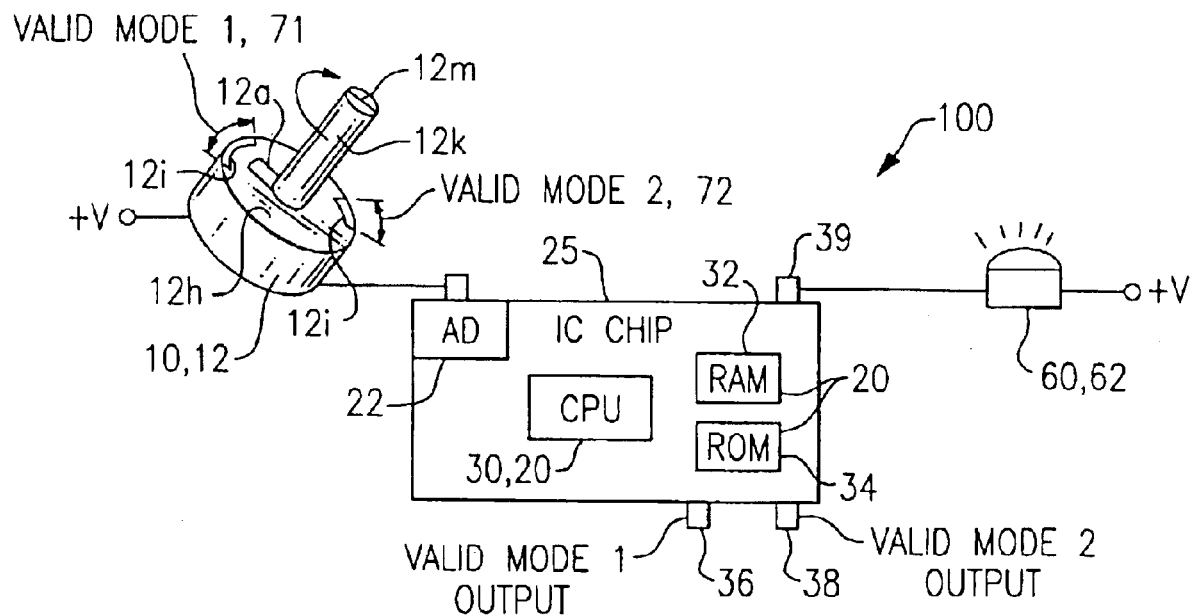
FIG. 1 is a physical schematic layout diagram of an embodiment of the invention comprising an potentiometer, an IC chip including an AD converter and a CPU, and a lamp.

The invention is described in detail with reference to FIGS. 1–6. Mode selector apparatus 10 in the embodiment of FIGS. 1 and 2 includes a potentiometer 12, also known as a variable resistor, and associated supply voltage, +V. In communication with potentiometer 12 is a control circuit 20 including a CPU 30. Further, a valid mode indicator 60,62 is responsive to control circuit 20. Control circuit 20 in the embodiment of FIG. 1 is disposed on an IC chip 25 which also comprises, in the embodiment of FIG. 1, an AD converter 22 for converting analog voltages from potentiometer 12 into digital form so that the output of potentiometer 12 can be read and processed by CPU 30. Control circuit 20 further includes a system RAM 32 mainly for storing working data and a system ROM 34 mainly for storing program data for operating mode selector 100, as will be described further herein particularly with reference to FIG. 3. System RAM 32 and ROM 34 in the embodiment of FIG. 1 are provided on IC chip 25. However, it will be understood that in another embodiment, RAM 32 and/or ROM 34 could be provided in discreet devices.

Figure 2:
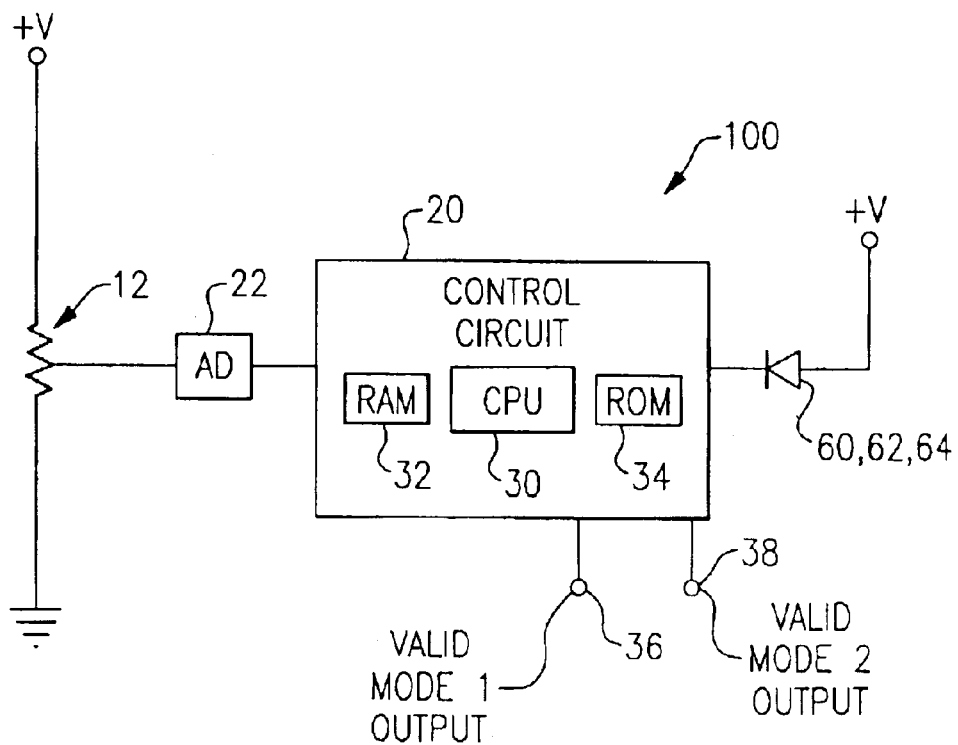
FIG. 2 is an electrical block diagram of an embodiment of the invention including a potentiometer, an AD converter, a control circuit comprising a CPU, and an LED indicator.

Control circuit 20 in the specific embodiment of FIGS. 1 and 2 drives two valid mode outputs, a first valid mode output 36 and a second valid mode output 38. In the embodiment of FIGS. 1 and 2, mode selector 100, includes two "valid modes" of operation. However, it will be understood that mode selector 100 could also have one valid mode or more than two valid modes. In the specific embodiment of FIG. 1 valid mode outputs 36, 38 are provided on pins of IC chip 25.

During a valid mode of operation, control circuit 20 causes output 36,38 corresponding to a given valid mode to exhibit a state indicating that selector 100 is operating in that mode. Typically, control circuit 20 writes a LOGIC 1 value to output e.g. 36 to indicate a valid mode, but could also write a LOGIC 0 to output e.g. 36 to indicate a valid mode and otherwise write a LOGIC 1 to output 36 when mode selector 100 is not operating in the particular valid mode. Mode selector 100 is typically disposed to be a part of a larger circuit, wherein the valid mode outputs 36,38 are in communication with circuit elements of the larger circuit so that valid mode outputs 36,38 control some aspect of the operation of the larger control circuit. In just one illustrative example of the invention, mode selector 100 can be utilized to control a voltage rating for the line voltage powering the larger circuit in which apparatus 100 is incorporated. Moving potentiometer 12 into a first valid mode position 71, as indicated in FIG. 1 may adapt the larger circuit to be powered by a 120V AC line voltage, while moving the potentiometer 12 into a second valid mode position 72 would adapt the larger circuit for use with 230V AC line voltage. If potentiometer 12 is not in a position necessary to establish either of the valid modes, neither of the valid mode outputs 36,38 is in a state indicating a valid mode.

Figure 3:
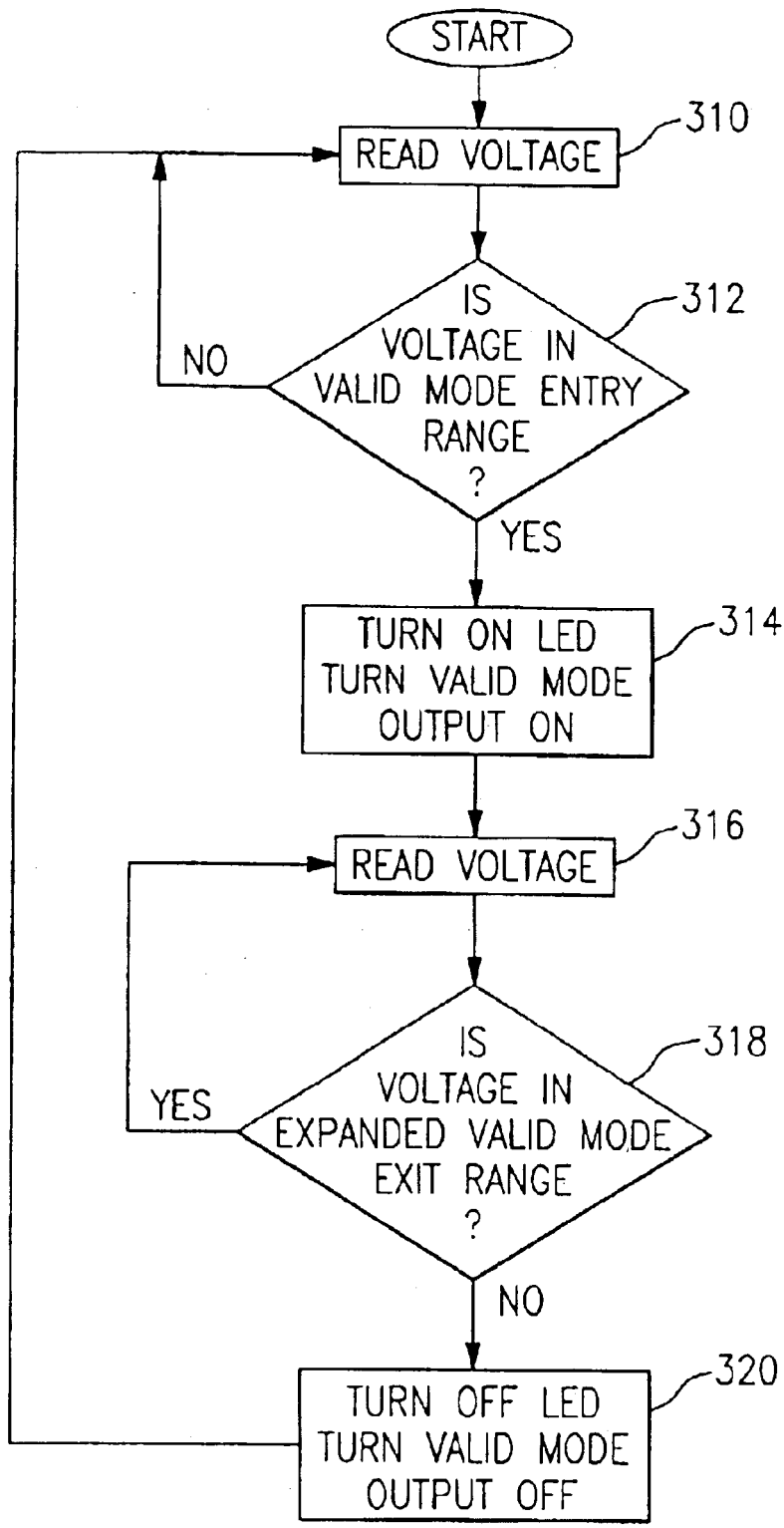
FIG. 3 is a map for illustrating the invention illustrating possible wiper positions of a rotary potentiometer of the invention correlated with binarized inputs, and operating modes, associated with the various wiper positions.
Figure 4:
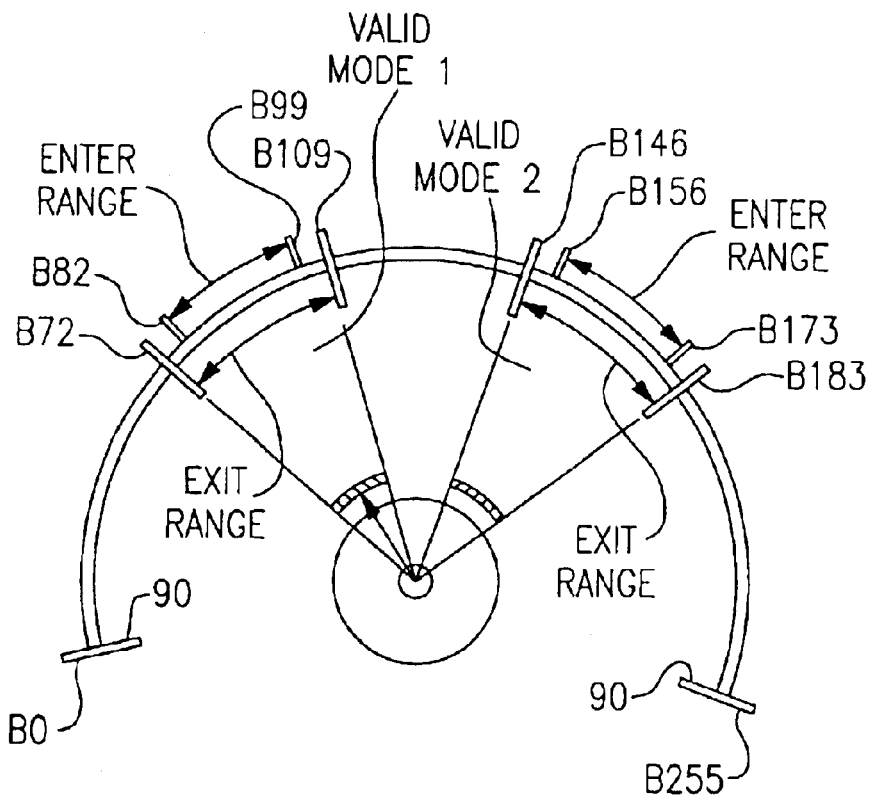
FIG. 4 is a flow diagram illustrating operation of a control circuit programmed in accordance with the invention in one embodiment.

Further aspects of the invention are described with reference to FIG. 3 showing a flow diagram illustrating the operation of control circuit 20 when operating in accordance with a program stored in system ROM 34, and FIG. 4 showing a map illustrating possible positions of potentiometer 12 correlated with corresponding input values and modes of operation of mode selector 100. At block 310, control circuit 20 reads the voltage output from potentiometer 12. As is indicated by FIG. 4, the converted output voltage may have input values ranging from binary 0 (00000000) to binary 255 (11111111), when control circuit 20 includes an 8 bit processor. Continuing with reference to the flow diagram of FIG. 3, control circuit 20 at block 312 determines whether the input voltage read from potentiometer 12 is in valid mode entry condition input value range, e.g., binary B82 to binary B99 as indicated in FIG. 3 for valid mode 1, illustrated in FIGS. 3 and 4. If control circuit 20 at block 312 determines that potentiometer 12 is in a entry condition range of valid mode indicating positions, control circuit 20 at block 314 may turn on LED 64 and charge the state of output e.g. 36 to indicate that a valid mode has been established, and then read another potentiometer input value at block 316. At block 318 control circuit 20 determines whether the input value (the value output by device 10) read at block 316 is in an exit condition range of valid mode indicating values. In the example of FIG. 4 valid mode 1 includes an exit range of between binary B72 and binary B109. If the variable device output value is outside of the exit condition range, control circuit 100 turns off LED 64 at block 320, or some other indicator 60, and change the state or output e.g. 36 before reading another value at block 310.

Figure 6:
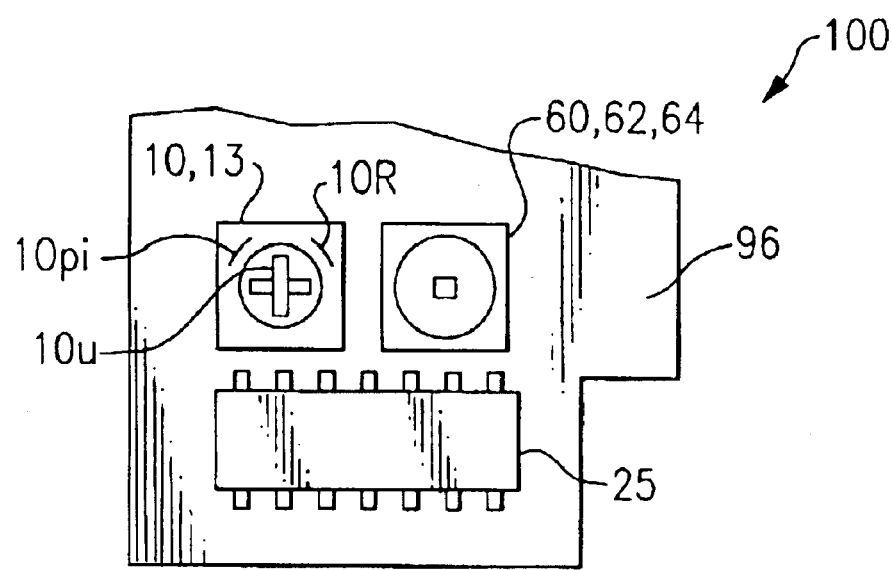
FIG. 6 is an embodiment of the invention including PCB mounted components.

As best seen from the illustrative map shown in FIG. 4, the valid modes of mode selector apparatus 100 include condition ranges that are wider than their corresponding enter condition ranges. Valid mode 1 in the example of FIG. 4 requires an input value of between binary B82 and B99 to be initially established, but for the mode of operation to subsequently change from a first valid mode operating state, an input value outside of the range of between binary B72 and B109, must be read by control circuit 20. Providing an exit condition range for a given valid mode wider than an enter condition range prevents the operation of mode selector 100 from being disrupted by slight input value changes attributable to for example, temperature, age, or fluctuations in source voltage which supplies supply voltage +V. It is seen in the example of FIG. 4 that if a valid mode establishing input value is on the border of an "enter condition range" e.g. at binary B172 in the case of valid mode 2, a slight change in the input into control circuit 20 will not result in mode selector apparatus 100 switching out of a valid mode 2 mode of operation. Mode selector 100 will switch operation out of a valid mode 2 operating state substantially only if a user desires mode selector 100 to switch out of a second mode state and manifests that desire by manually moving potentiometer knob 12k out of a valid mode 2 position. Knob 12k can be finger actuated as shown in FIG. 1 or tool driven as shown in FIG. 6.

Figure 7:
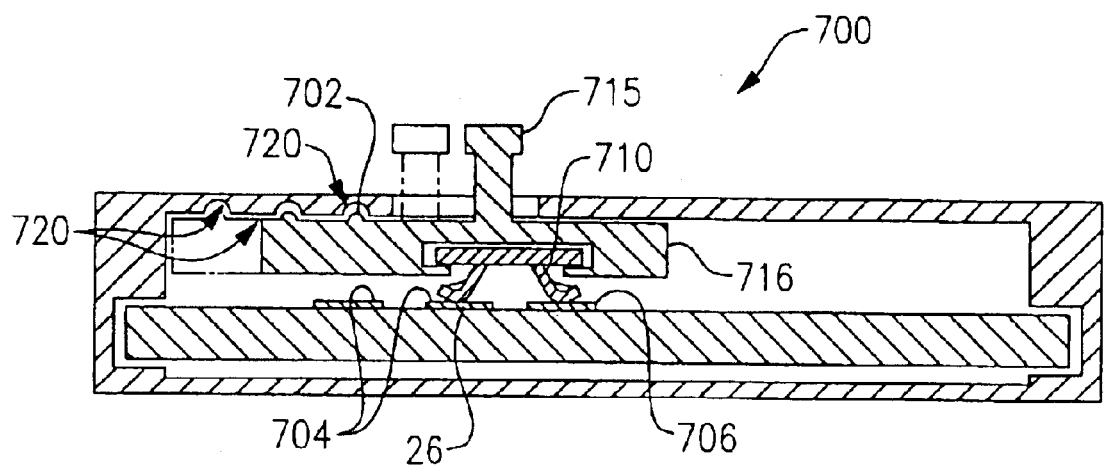
FIG. 7 is a prior art mode selector apparatus including mechanical position indicating mechanisms.
Figure 5:
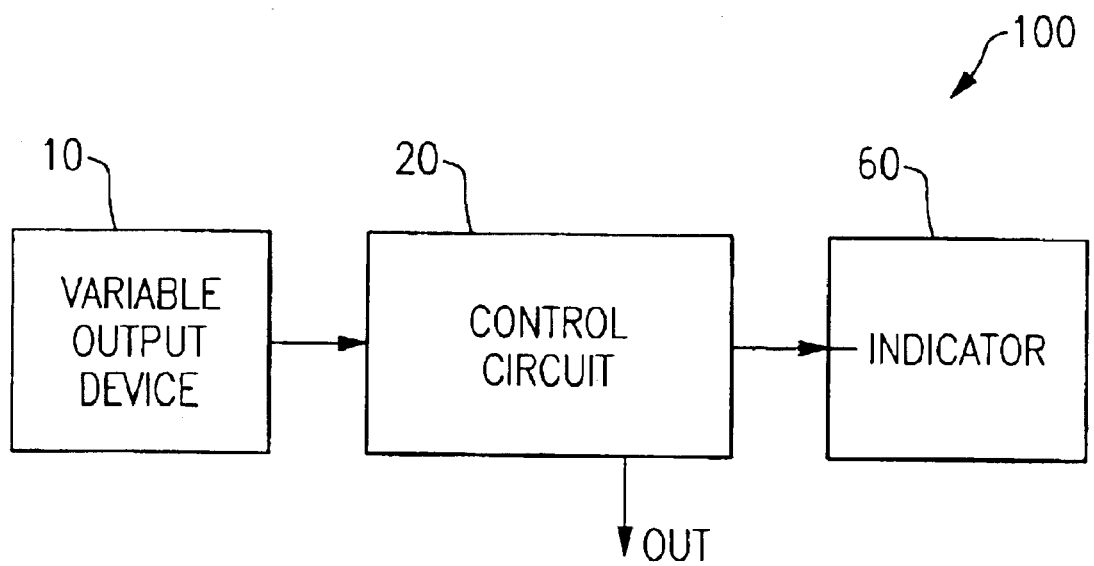
FIG. 5 is an embodiment of the invention expressed in generic form.

An important aspect of the invention, in one embodiment, is that potentiometer 12 (or similar device as will be explained) is devoid of any mechanism which may be termed a "feel position feedback mechanism" which aids a user in positioning potentiometer, and provides feel feedback as to the positioning of knob 12k. In the example of prior art switch 700 as shown in FIG. 7 "feel feedback mechanisms" which provide feedback to a user as to the positioning of slide knob 715 are provided by detent mechanisms 72, which receive slide member 716 in various positions as slide knob 715 is moved.

While incorporating a feel feedback mechanism into potentiometer 12 would not be deleterious to the operation of mode selector 100, certain advantages are yielded by selecting potentiometer 12 or other variable output devices to be a manually controlled output device devoid of any position feel feedback mechanism such as mechanisms of the prior art mode selector 700. Most notably, potentiometer 12 can purchased at reduced cost if it does not include any feel feedback mechanisms between any full scale limiting position (if any). The example of FIG. 4 corresponds to a potentiometer having low and high limits stop 90 defining the boundaries of full scale movement from 12k. The size requirements of potentiometer 12 are also reduced if potentiometer 12 does not include feel feedback mechanism. Further, because manually controlled variable output devices devoid of field feedback mechanisms have fewer parts, they are expected to be more reliable, and to exhibit longer life spans than manual variable output devices that have feel feedback mechanism.

In accordance with the invention, in one embodiment, variable position output device 10 includes visual position feedback elements without including any feel feedback position mechanisms, thus facilitating a mode selector that is less expensive, smaller, and more reliable than prior art mode selector 700. In FIG. 1, output device 12, shown as being provided by rotary potentiometer 12 includes a housing 12h having marking indicators 12i thereon for indicating the valid mode positions of device 12. Rotary knob 12k may include an alignment member 12a or marking 12m, or screwdriver slot (not shown) for indicating the position of knob 12k relative to housing 12h. It is understood that any of elements 12h, 12i, 12m, 12a, and 12k can be incorporated in any output device (e.g. rotary encoder). Generic rotary output device 10, shown in FIG. 6 includes indicating marking 10i and markings 10m having the same function as elements 12i and 12m. As alluded to previously, and in accordance with an important aspect of the invention, mode selector 100 may include a light sensor such as an LED 64 which is controlled by control circuit 20 to indicate to a user that mode selector apparatus 100 is operating in an valid mode. In embodiment of FIGS. 1 and 2, a user does not need a feel feedback mechanism of potentiometer 12 to be assured that potentiometer 12 is in a valid mode position since light source 62 and the combination of printed matter and member indicates to a user that mode selector is operating in a valid mode.

In may be advantageous to include more than one light source in mode selector 100. For example, control circuit 20 may turn on a red LED to indicate that mode selector is operating a first valid mode and a green LED to indicate that mode selector apparatus 100 is operating in a second valid mode. In the example of FIG. 1, a separate pin 39 of IC chip 25 is dedicated for the control of light source 62. However it is understood that the turning and ON and OFF of light source 62 or light sources of mode selector 100 could also be controlled by the logic state outputs output at valid mode output pins 36, 38. Further, a visual embodiment of indicator 60 could be provided by an alternative device such as a graphical icon of an LCD screen, as will be described herein.

In addition, the position feedback function of light source 62 could be provided by an acoustic output device such as a beeper or voice recording which operates alone or in combination with position indicating light source 62 or another position indicating element. Still further, mode selector 100 may have a feel feedback device that is driven by an output by control circuit 20. The control circuit driver feel feedback device could be provided in whole or in part by a vibrator or buzzer adapted for contact with a user which is activated when mode selector 100 operates in a valid mode. A mode selector apparatus having a feel feedback mechanism driven by an output of control circuit 20 would not require a passive mechanical feel position feedback mechanism incorporated in a manual variable output device, and therefore would feature the cost, size, and reliability advantages described therein.

Referring to further aspects of the invention, it will be understood that potentiometer 12 as described in FIGS. 1 and 2 could be replaced with any manually adjustable variable output device. In the genericized depiction of the invention shown in FIG. 5, output device 10 indicates a variable output device which may be for example, a potentiometer with or without an integrated AD converter, or a position encoder, such as an optical encoder, or a magnetic position sensor high tolerance potentiometer having integrated AD converters are often referred to by skilled artisans as position encoders. Output device 10 may be a rotary manually operable device as shown in FIGS. 1, 2, and 6 or else may be a slide type device as in FIG. 7. If device 10 is rotary driven, the rotating part or "knob" of device 10 may be finger actuated as shown in FIG. 1 or else may be for example drivable by a slotted screwdriver, a phillips head screwdriver as shown in FIG. 6, or a hex screwdriver. Specific manufacturer-available examples of output device 10 are: MICROPOTENTIOMETER series 8 mm to 16 mm potentiometers or WR3 Series trimmer potentiometers available from Productwell Precision Electrical Co. Ltd, a Sinostar Electronic LTD 11 mm to 33 mm metal shaft position encoder, a 0.5 W Cement Trimmer Potentiometer available from Filsonic Industries LTD, or one of the many potentiometers available from Tokyo Denshi LTD such as a PRM series potentiometer, a R-16K Series potentiometer, a RM series, a SC series, a SM series, a SR series or a Slide Potentiometer, which may be cased or uncased. As seen by the part list above, device 10 may be mechanically mountable, free standing, or mountable in a printed circuit board (PCB).

Referring to further aspects of mode selector 100, control circuit 20 can be provided on an IC chip including a CPU as indicated in FIG. 1. Because the functions required of control circuit 20 are limited, control circuit 20 can be provided by an inexpensive microprocessor chip such one of the many PIC series microprocessor chips available from Microchip, Inc. or Electronix Express, Inc. One specific microprocessor IC chip which may be utilized as control circuit 20 is a 16C715 8 bit microchip having on board AD available from Microchip, Inc. Of course, control circuit 20 need not include a CPU packaged in an integrated circuit. Control circuit 20 can be provided, for example, by an analog circuit, a digital logic circuit, a hybrid circuit, and can include one or more dedicated function programmable devices such as an FPGA or ASIC.

Light source 62 can include any suitable illumination device including a laser light source, an incandescent lamp, or an LED 64, such as a leaded type LED or a surface mount LED. By selecting light source 62 to be a surface mount device, light source 62 can be of a very small size. Light source 62 may be, for example, a SurfLED SML series surface mount LED, mountable in a printed circuit board (PCB) available from Ledtronics, Inc., which are available in single color, bicolor or multicolor models. Currently available SurfLED SML series LEDS consume a surface area of 3.4 mm by 2.8 mm, but smaller sizes are and will be available.

Referring to the specific physical representation example of the invention shown in FIG. 6, it can be seen that mode selector apparatus 100 can be provided in a highly miniaturized combination of PCB mounted parts. In the example of FIG. 6 variable output device 10,13 is provided in a PCB mounted rotary variable output device 13 mounted on PCB 96 actuatable by a slotted screw, control circuit 20 is provided in PCB mounted IC chip 25, and indicator 60 is provided in a surface mounted LED 64. Variable output device 13, IC chip 25 and LED 64 are arranged in a configuration (i.e. a first row comprising device 13 and LED 64, and a second row comprising chip 25) which minimizes surface area consumption. It will be seen that by appropriate selection of available component parts, the exemplary example of the invention shown in FIG. 6, can readily be provided by a combination of PCB mounted parts which consume less than about 10 mm×10 mm of surface area on PCB, and with appropriate selection of parts, less than 7 mm×7 mm and smaller.

While the present invention has been explained with reference to the structure disclosed herein, it is not confined to the details set forth and this invention is intended to cover any modifications and changes as may come within the scope of the following claims.

While the present invention has been particularly shown and described with reference to the preferred mode as illustrated in the drawing, it will be understood by one skilled in the art that various changes in detail may be effected therein without departing from the spirit and scope of the invention as defined by the claims.

We claim:

1. A mode selector apparatus comprising:
a variable output device having a variable output;
a control circuit responsive to said output of said variable output device, controlling at least one valid mode indicating output, wherein said control circuit is adapted to generate a valid mode indicating signal at said at least one valid mode output when said variable output device generates an output indicative of a valid mode;
a user perceivable indicator controlled by said control circuit, wherein said control circuit is adapted to actuate said indicator when said variable output device generates an output indicative of a valid mode.

2. The apparatus of claim 1, wherein said variable output device is a manually driven output device.

3. The apparatus of claim 1, wherein said variable output device is a manually driven rotary output device.

4. The apparatus of claim 1, wherein said variable output device is a slide type manually driven output device.

5. The apparatus of claim 1, wherein said output device is of a type adapted to mounted on a PCB.

6. The apparatus of claim 1, wherein said output device is a potentiometer.

7. The apparatus of claim 1, wherein said output device is a position encoder.

8. The apparatus of claim 1, wherein said user-perceivable indicator is a visual feed back indicator, selected from a group consisting of an electronically generated icon, and a light source.

9. The apparatus of claim 1, wherein said user-perceivable indicator is a light source.

10. The apparatus of claim 1, wherein said user-perceivable indicator is an acoustic output device.

11. The apparatus of claim 1, wherein said user-perceivable indicator is an electronically driven feel feedback indicator driven by said control circuit.

12. The apparatus of claim 1, wherein said mode selector includes a plurality of valid mode indicating outputs, each controlled by said control circuit, wherein said mode selector apparatus is configured to establish a plurality of valid operating modes, wherein during each valid operating mode of said mode selector apparatus, a valid mode indicating signal is generated at a specific one of said valid mode indicating outputs.

13. The apparatus of claim 1, wherein said output device includes a housing having plurality of valid mode indicating markings, each marking indicating a range of mechanical actuating member positions at which one of said valid operating modes is established.

14. The apparatus of claim 1, wherein said output device is substantially devoid of any feel feedback mechanisms intermediate of stop limit positions of said output device.

15. A mode selector including:
a rotary type manually driven variable output device;
a control circuit responsive to said variable output device, and controlling at least one valid mode output; and
a user-perceivable indicator responsive to said control circuit, wherein said control circuit is configured to read output values from said variable output device, and wherein said control circuit is further adapted to actuate said user-perceivable indicator if said read values indicate a valid operating mode.

16. The mode sector of claim 15, further including a valid mode indicating output controlled by said control circuit, wherein said control circuit is further adapted to generate a valid mode indicating signal at said valid mode output if said read values indicate a valid mode.

17. The mode selector of claim 15, wherein said control circuit, in determining whether to initially establish a valid operating mode, determines if said read output values are within an enter condition range of values, and wherein said control circuit, in determining whether to exit a valid operating mode, determines if said read values are within an exit condition range of read values, said exit condition range being larger than and encompassing said enter condition range of values.

18. The mode selector of claim 15, wherein said user-perceivable indicator is a light source, and wherein a housing of said output device includes a marking indicating at least one valid mode position of a rotary knob of said rotary type manually driven variable output device.

19. The mode selector of claim 15, wherein said output device is selected from a group consisting of a potentiometer and a position encoder.

20. The mode selector of claim 15, wherein said mode selector includes a plurality of valid mode indicating outputs, each controlled by said control circuit, wherein said mode selector is configured to establish a plurality of valid operating modes, wherein during each valid operating mode of said mode selector apparatus, a valid mode indicating signal is generated at a specific one of said valid mode indicating outputs.

21. The mode selector of claim 15, wherein a housing of said output device includes a plurality of valid mode indicating markings, each marking indicating a range of knob positions at which one of said valid operating modes is established.

22. The apparatus of claim 15, wherein said output device is substantially devoid any feel feedback mechanisms intermediate of stop limit positions of said output device.

23. A mode selector apparatus comprising:
   a surface mount rotary type manually drivable variable output device adapted for mounting on a PCB;
   a control circuit incorporated in an IC chip, responsive to said variable output device, wherein said IC chip is adapted for mounting on a PCB; and
   an LED indicator, responsive to said control circuit, and adapted for electrical connection to a PCB, wherein said control circuit is adapted to read output values from said output device, and to actuate said LED indicator if said output values indicate that a rotary part of said output device is in a valid mode position.

24. The apparatus of claim 23, wherein said output device is of a type having a rotary part drivable by a screwdriver selected from a group consisting of a slotted, phillips, hex, and star screwdrivers.

25. The apparatus of claim 23, wherein said LED is a leaded LED.

26. The apparatus of claim 23, wherein said LED is a surface mount LED.

27. The apparatus of claim 23, wherein said output device and said control circuit are in communication with one another via at least one electrical conductor provided by at least one PCB tracing.

28. The apparatus of claim 23, wherein said surface mount output device, IC chip and surface mount LED are in a space conserving configuration on a PCB characterized by a first row including said surface mount output device and said LED arranged in close proximity with one another; and a second row including said IC chip arranged in close proximity with both of said surface mount output device and said LED.

29. The mode selector of claim 23, wherein said user perceivable indicator is a light source, and wherein a housing of said output device includes a marking indicating at least one valid mode position of a rotary knob of said rotary type manually driven variable output device.

30. The apparatus of claim 23, wherein said output device is substantially devoid any feel feedback mechanisms intermediate of stop limit positions of said output device.

* * * * *